United States Patent [19]

Atkinson

[11] Patent Number: 5,155,053
[45] Date of Patent: Oct. 13, 1992

[54] METHOD OF FORMING T-GATE STRUCTURE ON MICROELECTRONIC DEVICE SUBSTRATE

[75] Inventor: Gary M. Atkinson, Santa Monica, Calif.

[73] Assignee: Hughes Aircraft Company, Los Angeles, Calif.

[21] Appl. No.: 705,870

[22] Filed: May 28, 1991

[51] Int. Cl.$^5$ .......................................... H01L 21/265
[52] U.S. Cl. ........................................ 437/40; 437/41; 437/44; 437/184; 437/203
[58] Field of Search ....................... 437/40, 41, 44, 45, 437/184, 203, 937

[56] References Cited

U.S. PATENT DOCUMENTS

| | | | |
|---|---|---|---|
| 4,334,349 | 6/1982 | Aoyama et al. | 437/203 |
| 4,700,462 | 10/1987 | Beaubien et al. | 437/40 |
| 4,771,017 | 9/1988 | Tobin et al. | 437/184 |
| 4,959,326 | 9/1990 | Roman et al. | 437/40 |
| 4,975,382 | 12/1990 | Takasugi | 437/40 |
| 5,053,348 | 10/1991 | Mishra | 437/40 |

Primary Examiner—Brian E. Hearn
Assistant Examiner—Kevin M. Picardat
Attorney, Agent, or Firm—E. E. Leitereg; W. K. Denson-Low

[57] ABSTRACT

A T-gate structure (28a) is fabricated on a microelectronic device substrate (10) using a trilevel resist system in combination with a two-step reactive ion etching (RIE) technique utilizing an oxygen plasma. The trilevel resist consists of a planarizing resist layer (12), masking layer (14) and imaging resist layer (16), which are formed on the surface (10a) of the substrate (10). A focused ion beam (18) is then used to expose the uppermost imaging layer (16) with an image having a width equal to the desired gate length of the T-gate structure (28a). The imaged area is developed and etched to form an opening (14a,16a) of the same width through the imaging layer (16) and also through the masking layer (14). In the first oxygen RIE step, the planarizing resist layer (12) is etched isotropically through the opening (14a,16a), partially down to the substrate surface (10a) to form a cavity (12a) having a width which is larger than the width of the opening (14a,16a). The second oxygen RIE step is used to etch the planarizing resist layer (12) through the opening (14a,16a) completely down to the substrate surface (10a) to form a notch (12a) underneath the cavity (12a) having a width substantially equal to the width of the opening (14a,16a) and thereby the gate length of the T-gate structure (28a). The imaging layer (16) and masking layer (14) are removed, and metal (28) is evaporated onto the substrate (10) to fill the cavity (12a) and notch (12b) and thereby form the T-gate structure (28a). The first resist layer (12) and overlying metal (28) are lifted off, leaving the T-gate structure (28a) on the surface (10a) of the substrate (10).

30 Claims, 7 Drawing Sheets

METHOD OF FORMING T-GATE STRUCTURE ON MICROELECTRONIC DEVICE SUBSTRATE

BACKGROUND OF THE INVENTION

1. Field of the Invention

The present invention relates to a method of forming a T-gate structure for a microelectronic device such as a high-electron mobility transistor (HEMT) on the surface of a substrate.

2. Description of the Related Art

The HEMT is a variant of gallium arsenide field effect transistor (FET) technology that offers substantially better performance than standard metal-semiconductor field effect transistor (MESFET) devices, particularly at low temperatures. HEMT substrates are usually fabricated by molecular beam epitaxy (MBE), in which the device layers are built up by deposition of molecules in a vacuum. A conventional HEMT uses an undoped gallium arsenide (GaAs) channel which is supplied with electrons by a thin aluminum gallium arsenide (AlGaAs) doping layer between the channel and the controlling gate electrode. This separation of the channel dopant layer, where electron scattering is high, from the channel itself, significantly increases the mobility of the electrons in the channel. It is the high mobility of the carriers that provides the fundamental advantage of HEMT technology over conventional MESFET devices in high frequency operation.

In order to achieve the highest frequency operation from HEMT devices, it is also necessary to reduce the distances over which the gate's field effect control of the electrons in the channel must take place, thereby reducing the parasitic resistances and capacitances that limit device speed. The primary critical dimension concerned is the length of the gate electrode itself, which defines the distance the electrons must traverse underneath the gate during the operation of the device. A shorter gate length decreases the transit time for carriers in the channel, however, it also increases the series resistance of the gate electrode itself, slowing down the device. Therefore, it is desirable for a HEMT device to have a T-shaped gate, in order to provide a short gate length to the channel in combination with a wide upper cross section for low gate series resistance.

The conventional method of forming a T-gate structure relies on either a two layer or three layer resist technology in combination with electron beam exposure. In the two layer, or bilevel resist technique, the upper layer is more sensitive to the electron beam exposure, while the lower layer is less sensitive. When exposed with an electron beam and developed, the upper more sensitive layer develops into a wide cavity, while the lower layer develops to a narrower width, creating a "wine goblet" shaped cavity. Metal is deposited onto the substrate which fills the cavity and forms the desired T-shaped gate therein. The resist layers and overlying metal are removed by dissolving the resist layers and lifting off the metal, leaving the T-gate structure on the surface of the substrate.

In the three layer electron beam resist approach, an additional less sensitive layer is added to the top of the resist. After exposure, this uppermost layer develops to a slightly narrower width than more sensitive layer underneath it, creating a slight overhang, or retrograde profile to the cavity in the resist. After metal deposition, this retrograde profile improves the separation between the metal filling the resist cavity and that overlying the resist, facilitating the lift off removal process. This method is described in an article entitled "Electron Beam Fabrication of GaAs Low-Noise MESFETS Using a New Trilayer Resist Technique", by P. Chao et al, in IEEE Transactions on Electron Devices, Vol. ED-32, No. 6, Jun. 1985, pp 1042-1046.

The bilevel and trilevel resist methods with electron beam exposure have been used to fabricate T-gate structures with gate lengths as short as approximately 50 nm. This has enabled the fabrication of HEMTs with current-gain cutoff frequency $f_T$ of up to 250 GHz. However, both of these methods are inherently limited in resolution since the gate length is defined at the bottom of the resist structure, after the electron beam has passed through the entire thickness of the resist layers. Since the extremely light electrons are scattered as the beam passes through the resist, the resolution of the exposure degrades by the time the beam reaches the bottom of the resist. Although higher resolution can be obtained in thin resist imaging layers, there have not been any practical methods proposed to date of providing a thin imaging layer technique for fabricating T-Gate structures.

SUMMARY OF THE INVENTION

The present method provides a method for forming a T-shaped gate for a HEMT or other microelectronic device on a surface of a substrate. The method utilizes a thin surface imaging layer, maximizing the obtainable resolution in the exposure, and then transfers the exposure down to the subsequent resist layers without loss of resolution using a novel two step reactive ion etching technique. This method enables the fabrication of T-gate structures limited only by the beam width of the exposure system (typically 5–10 nm) and the edge acuity of anisotropic reactive ion etching (RIE), which is typically 5–10 nm. This is the only available practical method for forming HEMT devices with gate lengths at these dimensions (10–30 nm), which will be required to achieve current-gain cutoff frequencies $f_T$, of 500 Ghz and higher.

For fabricating a T-gate structure for a HEMT, the substrate will typically consist of a contact layer, Schottky barrier layer, donor layer, spacer layer, channel and buffer layers which are epitaxially deposited on a substrate wafer such as gallium arsenide. In accordance with the method of the present invention, a first resist layer is formed on the surface of the substrate. The first resist layer is a planarizing layer of poly-methyl-methacrylate (PMMA). A masking layer of germanium (Ge) is formed over the resist layer, and a second imaging layer of PMMA is formed over the masking layer, forming a three layer or trilevel resist structure.

The PMMA imaging layer is exposed to a focused ion beam (FIB) having a beam width substantially equal to the desired gate length of the T-gate structure, and developed therethrough having a width equal to the gate length. The masking layer of germanium is anisotropically etched by RIE through the opening in the second resist layer to extend the opening through the masking layer with the same gate length dimension.

The first, or planarizing resist layer is then etched down to the substrate with a novel, two step RIE technique. In the first step, the planarizing resist layer is isotropically etched through the opening in the masking layer partially through to the substrate surface using RIE to form a cavity in the first resist layer, underneath the opening, having a width which is larger than that of the opening. The remaining thickness of the first resist layer is then etched through the opening, completely through to the substrate surface with an anisotropic RIE process, that forms a high resolution notch, extending from the bottom of the cavity in the first resist layer to the substrate surface, of a width substantially equal to the same gate length as the mask layer opening. Being of similar material, the second, imaging resist layer is generally removed during these same isotropic and anisotropic RIE steps.

The masking layer is then removed, using an anisotropic RIE process, leaving a "wine goblet" shaped resist profile in the remaining planarizing resist layer. For improved device performance, the uppermost layer of the MBE grown substrate, the ohmic contact layer, is typically removed at this point. An electrically conductive metal is then deposited over the first resist layer into the cavity and notch, such that the conductive metal adheres to the substrate surface at the bottom of the notch. The conductive material in the cavity and notch form the T-gate structure. The first resist layer and overlying metal are lifted off to leave the T-gate structure on the substrate. The source, drain and other elements of the microelectronic device are then fabricated on the substrate surface.

Although the preferred embodiment of imaging the upper resist layer is using a FIB, the scope of the invention is not so limited, and further includes imaging using an electron beam, optical beam or x-ray beam. In the same manner, though the preferred embodiment of etching the planarizing layer is using RIE, the scope of the invention is not so limited, and further includes other etching techniques such as plasma etching, magnetron enhanced reactive ion etching, radical ion beam etching and electron cyclotron resonance etching techniques.

In an alternative embodiment of the invention, the order of the isotropic and anisotropic RIE steps may be reversed, thereby forming a high resolution notch partially or entirely through the planarizing resist layer, and then forming a wider cavity in the upper section of the planarizing layer using isotropic RIE.

In another embodiment, the imaging resist layer and the masking layer may be replaced by a single resist layer which has the function of these two layers combined, such as a single resist layer formed of a self-developing organosilicon film.

It is also possible to practice the present method using only one resist layer, forming a coating on the surface of the resist layer which performs the functions of the masking and imaging resist layers using a silylating resist process.

The present method enables the fabrication of T-gate structures in thick resist layers with gate lengths limited only by the exposing beam width of the exposure technique and the edge acuity of RIE. Loss of resolution of the exposure image is negligible due to the ability to make the imaging resist layer extremely thin. Additionally, the extremely high edge acuity available with RIE is able to transfer that image down through thick resist layers with minimal loss of resolution. Thus the present method enables precise pattern definition at the bottom of the resist, which defines the critical gate length of the T-gate structure, in a manner not possible using the prior art electron beam process.

Additionally, the present invention is completely compatible with the highly preferable self-aligned gate HEMT fabrication techniques, which further improves the frequency response of the HEMT devices.

These and other features and advantage of the present invention will be apparent to those skilled in the art from the following detailed description, taken together with the accompanying drawings, in which like reference numerals refer to like parts.

DETAILED DESCRIPTION OF THE INVENTION

Figure 1:
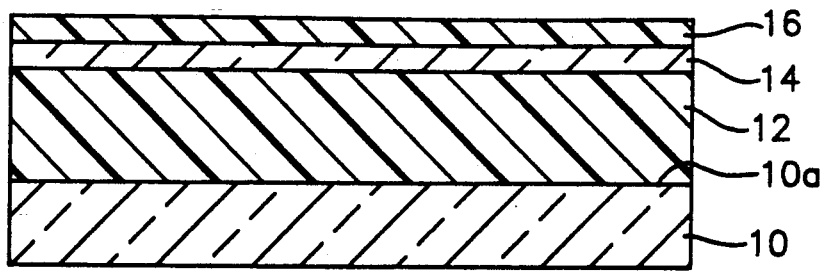
FIGS. 1 to 9 are simplified sectional views illustrating a preferred method of fabricating a T-gate structure on a microelectronic device substrate in accordance with the present invention.

The method of the present invention includes providing a substrate 10 as illustrated in FIG. 1. Although not specifically shown in the drawing, the substrate 10 includes a wafer made of a semiconductive or semi-insulating material, preferably GaAs or InP, onto which the necessary buffer, superlattice, channel, spacer, donor, Schottky barrier and contact layers are formed epitaxially on the wafer to constitute a layered structure for a HEMT or other microelectronic device. The surface of the upper epitaxial layer of the substrate 10 is considered to be the surface 10a of the substrate 10. It will be noted that in a recessed gate configuration (not shown), the exposed walls of the recess are considered to be part of the surface 10a.

As further illustrated in FIG. 1, a planarizing or first resist layer 12 is deposited over the surface 10a of the substrate 10. The layer 12 is preferably formed of PMMA to a thickness of approximately 500 nm. A masking layer 14 of low stress germanium (Ge) or silicon (Si) is deposited over the first resist layer 12 to a thickness of approximately 15 nm. A second imaging resist layer of PMMA is then deposited over the masking layer 12 to a thickness of approximately 60 nm.

It is also possible to practice the elements of this invention using alternative materials for the trilevel structure. Other planarizing polymer resist materials, such as standard optical photoresists, electron beam resists or plasma deposited polymers can function in place of the PMMA planarizing layer. A variety of thin metal layers may also be substituted for the germanium and silicon layers, such as tungsten, titanium, tantalum or aluminum, within the scope of the present invention. Other thin imaging layers can also be substituted for the thin PMMA layer, as may be appropriate if an exposure technique other than FIB is used, and are also within the scope of the invention.

Figure 2:
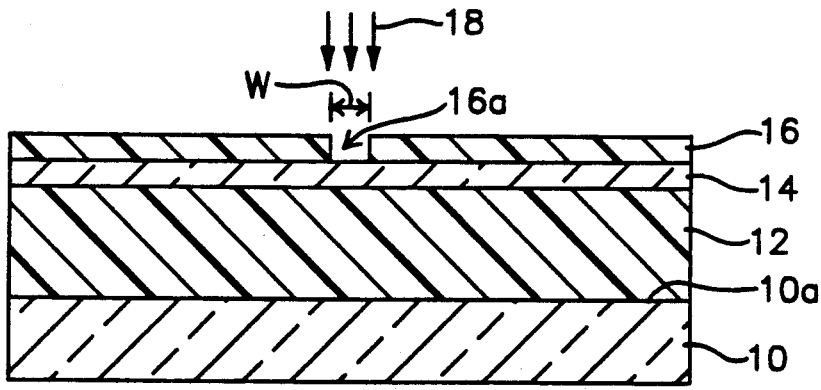

As illustrated in FIG. 2, the second resist layer 16 is exposed to an imaging exposure using a beam as designated by arrows 18, the exposed region having a width W which is substantially equal to the desired gate length of the T-gate structure. In the preferred form of the invention, the beam 18 is a focused ion beam (FIB) of 50 keV gallium (Ga) ions with a beam width of approximately 10 nm. However, the scope of the invention further includes imaging the layer 16 using an electron beam, optical beam, or x-ray beam. The exposed second resist layer 16 is then developed using a conventional resist developer, such as a solution of three parts isopropyl alcohol, one part methylisobutyl-ketone isobutyl-ketone, for 15 seconds followed by a 60 second isopropyl alcohol rinse, to form an opening 16a through the layer 16 having substantially the width W.

Figure 3:
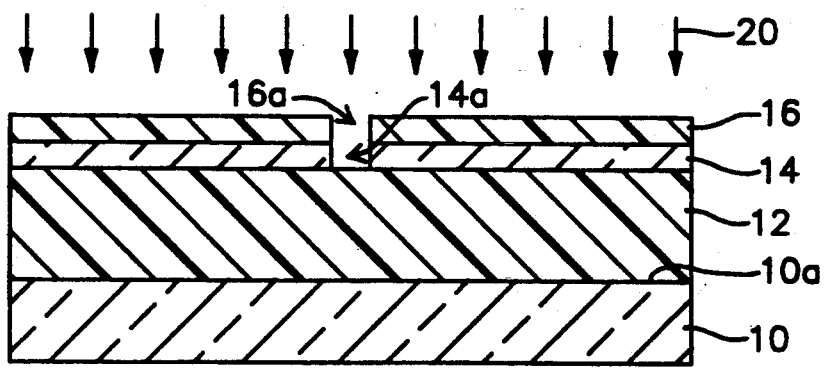

In the next step of the method as illustrated in FIG. 3, the masking layer 14 is etched through the opening 16a in the layer 16 as indicated by arrows 20 to extend the opening 16a down to the first resist layer 12. The opening through the masking layer 14 is designated as 14a. The step of FIG. 3 is preferably performed using RIE with carbon tetrafluoride ($CF_4$). plasma at a flow rate of 20 $cm^3$/min, chamber pressure of 50 mTorr, plasma potential of 45 volts, and etch rate of 7.8 nm/min, although the invention is not so limited.

The etchant used in the step of FIG. 3 is selected such that it will not significantly affect the layers 16 and 12 while etching through the masking layer 14. The second resist layer 16 therefore acts as a mask during the etching step, such that the masking layer 14 will only be etched through the opening 16a. Due to the very thin masking layer (15 nm), the width of the opening 14a is substantially equal to the width W of the opening 16a. The masking layer 14 can be made thicker and still be used in accordance with the invention as long as the etching process 20 used to create the opening is sufficiently anisotropic to create an opening 14a that is substantially equal to the desired width W.

Figure 4:
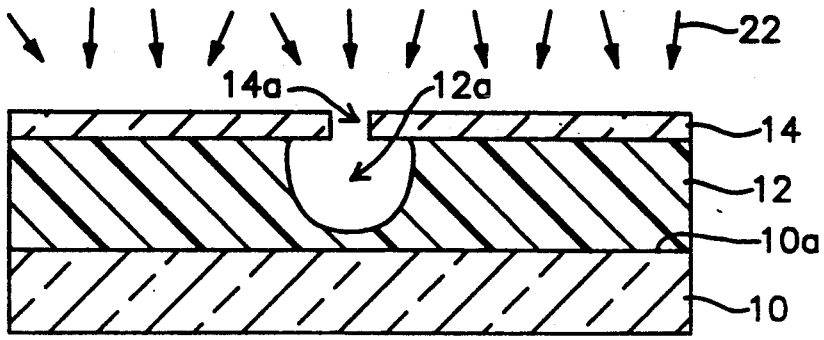

As illustrated in FIG. 4, the first resist layer 12 is etched through the openings 14a and 16a using isotropic RIE as indicated by arrows 22 to form a cavity 12a therein. The isotropic etching undercuts the masking layer 14 so that the cavity 12a is considerably wider than the width W of the openings 14a and 16a. For desirable HEMT device characteristics, when the fabricated gate length (substantially equal to W) is 25–50 nm, the cavity 12a will preferably be etched to a width on the order of 100–250 nm.

The isotropic RIE step of FIG. 4 is preferably performed using an oxygen ($O_2$) plasma at a flow rate of 20 $m^3$/min, a chamber pressure of 90 mTorr and a plasma potential $-75$ volts. The preferred etch rate is 17.5 nm/min. It will be understood, however, that these values do not limit the scope of the invention. It is also possible to practice the invention as described, using methods other than reactive ion etching (RIE) for the isotropic etching process 22. Alternative etching methods including standard plasma etching, magnetically enhanced reactive ion etching, electron cyclotron resonance, reactive ion beam ion etching, microwave plasma etching or radical beam etching, can also be used for the isotropic etching process 22, within the scope of the present invention, as long as the etching process used produces the desired isotropic etching result.

In the preferred embodiment, the isotropic RIE with oxygen plasma also removes the second resist layer 16 from the masking layer 14. The etchant used in the step of FIG. 4 is selected such that it will not significantly affect the masking layer 14.

Figure 5:
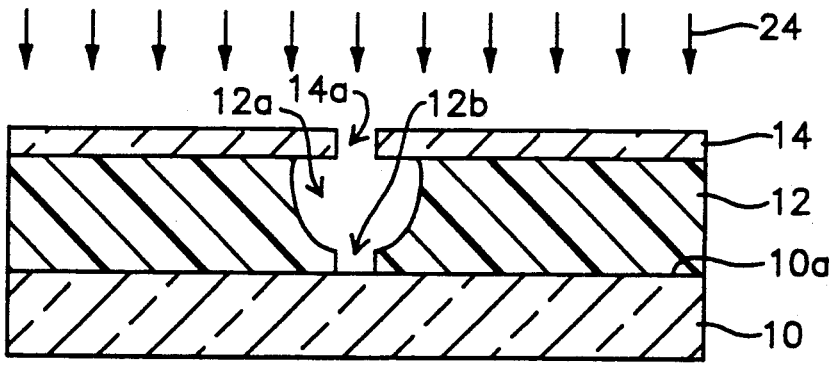

The next step of the method is illustrated in FIG. 5. The first resist layer 12 is etched through the opening 14a in the masking layer 14 using anisotropic RIE as indicated by arrows 24 to form a notch 12b underneath the cavity 12a. The notch 12b extends completely down to the surface 10a of the substrate 10. Due to the anisotropic nature of the etching, the width of the notch 12b is substantially equal to W.

The anisotropic RIE step of FIG. 5 is preferably performed using an $O_2$ plasma at a flow rate of 20 $cm^3$/min, chamber pressure of 2 mTorr and a plasma potential of $-45$ volts. The preferred etch rate is 7 nm/min. The extremely low pressure reduces the scattering of the ions in the RIE plasma and produces an etching profile that is highly anisotropic. This highly anisotropic property, combined with the fact that the $O_2$ plasma does not appreciably alter the masking layer 14, causes the notch 12b to only be etched in the area of the first resist layer 12 directly underlying the opening 14a. The step of FIG. 5 is performed at low plasma potential to avoid damaging the substrate 10 when the notch 12b has been etched completely through the first resist layer 12 to the surface 10a.

As with the isotropic etching process described previously, it is also possible to practice this invention using an alternative method for the anisotropic etching process 24. As before, alternative etching methods using standard plasma etching, magnetically enhanced reactive ion etching, electron cyclotron resonance, reactive ion beam ion etching, microwave plasma etching or radical beam etching, can also be used for the anisotropic etching process 24, within the scope of the present invention, as long as the etching process used produces the desired anisotropic etching result.

The steps of the method described above form the opening 16b in the relatively thin second resist layer 16 having the width W desired for the gate length of the T-gate structure, and precisely extend the opening 16a down through the masking layer 14 and second resist layer 16 to form the notch 12b with substantially the same width as the opening 16a. The notch 12b defines the bottom of the desired T-gate structure, while the wider cavity 12a defines the top of the structure.

Figure 6:
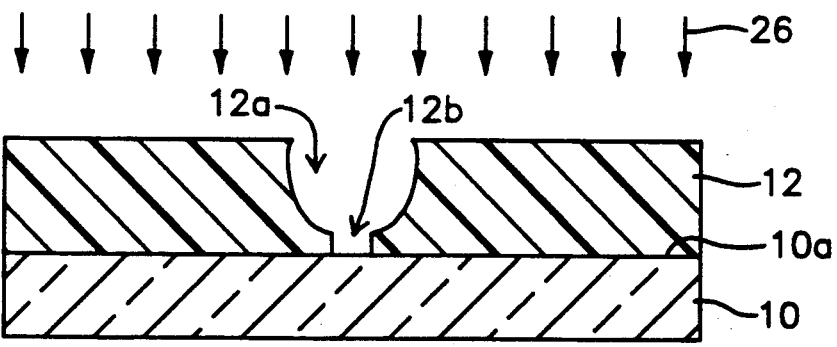

In the next step of the present method as illustrated in FIG. 6, the masking layer 14 is removed using a wet chemical solution or RIE etching with $CF_4$ plasma as indicated by arrows 26 to leave only the first resist layer 12 remaining on the substrate 10 with the cavity 12a and notch 12b formed therein. The preferred embodiment uses a RIE etching process with a 20 $cm^3$/min $CF_4$ flow rate, 50 mTorr chamber pressure, $-45$ Volts plasma potential and an etch rate of 7.8 nm/min, although the invention is not so limited.

Figure 7:
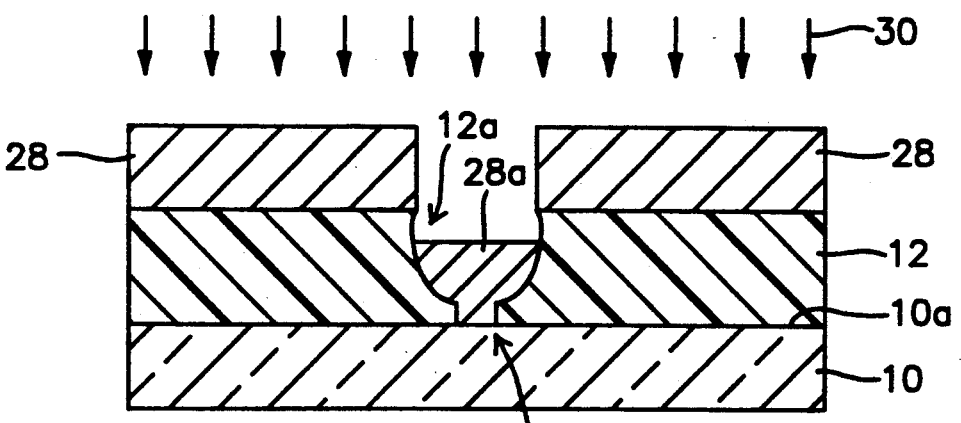

If the remaining resist cavity 12a is such that it contains an overhang of too great an extent, it can be removed with a short, low pressure and low plasma potential anisotropic $O_2$ RIE process step before proceeding to the process step illustrated in FIG. 7. In the preferred embodiment, this step is omitted because the overhang produced by the isotropic etching of the resist cavity 12a is already suitable for the subsequent processing steps.

In a typical HEMT process in which a contact layer is formed over the Schottky barrier layer during the molecular beam epitaxial growth, the contact layer is usually removed in the gate region at this point, forming a recessed surface, using the resist layer 12 as a mask. For the purposes of this description, in such a recessed gate configuration, the walls of the recess are considered to be a part of the surface 10a.

As illustrated in FIG. 7, an electrically conductive metal 28, preferably in the form of a multi-layer metal structure including layers of titanium (Ti), platinum (Pt), and gold (Au), is evaporated onto the first resist layer 12 and into the cavity 12a and notch 12b as indicated by arrows 30 such that the metal 28 adheres to the surface 10a of the substrate 10 at the bottom of the notch 12b, forming a Schottky barrier contact. The portion of the metal 28 in the cavity 12a and notch 12b constitutes the desired T-gate structure, which is designated as 28a.

Figure 8:
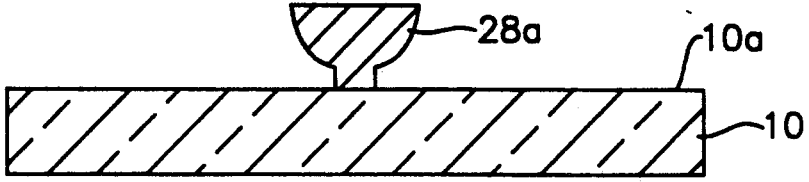

As illustrated in FIG. 8, the first resist layer 12 and overlying metal 28 are lifted off by dissolving the layer 12 in a conventional solvent, such a methylenechloride, to leave only the T-gate structure 28a remaining on the surface 10a of the substrate 10.

Figure 9:
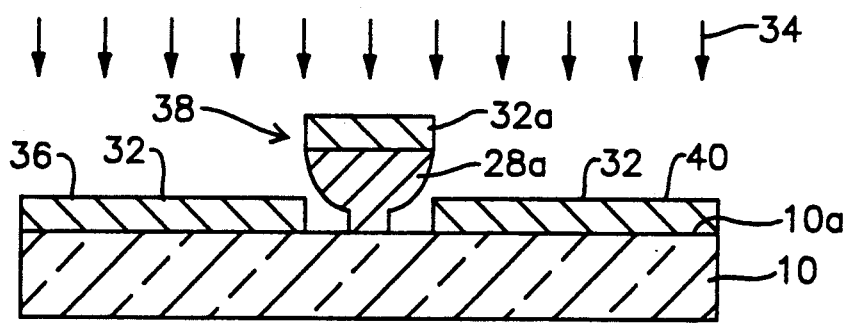

A microelectronic device such as a HEMT or other FET incorporating the T-gate structure 28a may be fabricated using additional process steps such as illustrated in FIG. 9. As shown, an electrically conductive metal 32, preferably in the form of a multi-layer metal structure including layers of alloyed gold and germanium, nickel (Ni), and gold, is deposited onto the substrate 10 as indicated by arrows 34. The top of the T-gate structure 28a acts as a mask such that no metal 32 is deposited onto the surface 10a underneath the structure 28. A portion of the metal 32 is deposited onto the top of the structure 28a as designated at 32a, which is desirable since it increases the cross sectional area of the structure 28a, reducing the series resistance of the gate electrode.

Another portion of the metal 32 is deposited onto the surface 10a leftward of the structure 28a to form a source 36 of an FET 38. Another portion of the metal 32 deposited rightward of the structure 28a to form a drain 40 of the FET 38. The spacing between the source 36 and drain 38 define the channel length of the FET 38, which is substantially equal to the width of the top of the T-gate structure 28a. The source/drain contacts and channel of the FET 38 are self-aligned to the gate in the process step of FIG. 9.

In alternative methods of fabricating HEMT devices and FETs, the source/drain contacts are not self-aligned to the gate, as described here. As long as the gate itself is fabricated as outlined by the methods herein, it is considered to be within the scope of this invention.

Figure 10:
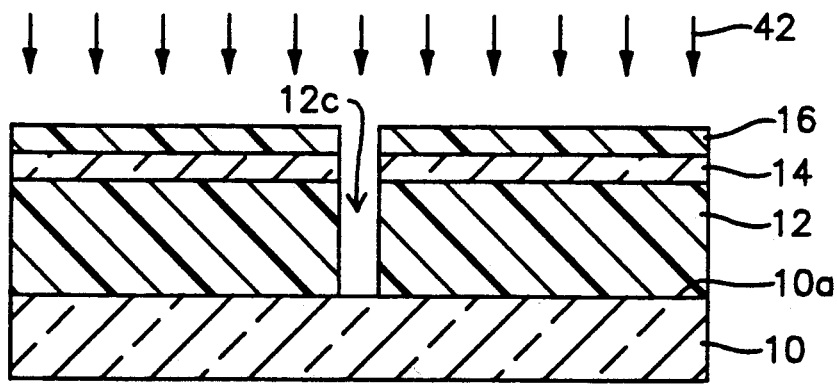
FIGS. 10 to 13 are simplified sectional views illustrating another method of fabricating a T-gate structure according to the invention, in which the isotropic etching step and anisotropic etching steps are reversed.

Another alternative method of practicing the present invention is illustrated in FIGS. 10 to 13, in which the isotropic and anisotropic RIE steps are reversed. The first resist layer 12, masking layer 14 and second resist layer 16 are deposited on the substrate 10 and formed with the openings 14a and 16a in the same manner as in FIGS. 1 to 3. Then, as illustrated in FIG. 10, a notch 12c is formed completely through the first resist layer 12 using low pressure, low voltage anisotropic RIE as indicated by arrows 42. The width of the notch 12c is substantially equal to W. Preferably, the etching step of FIG. 10 also removes the second resist layer 16 from the masking layer 14.

Figure 11:
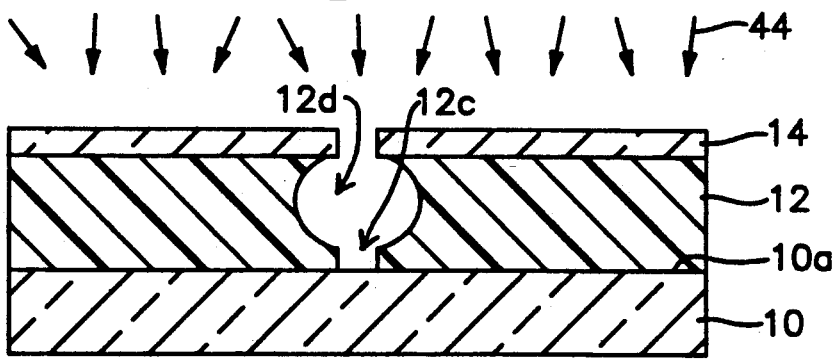
Figure 12:
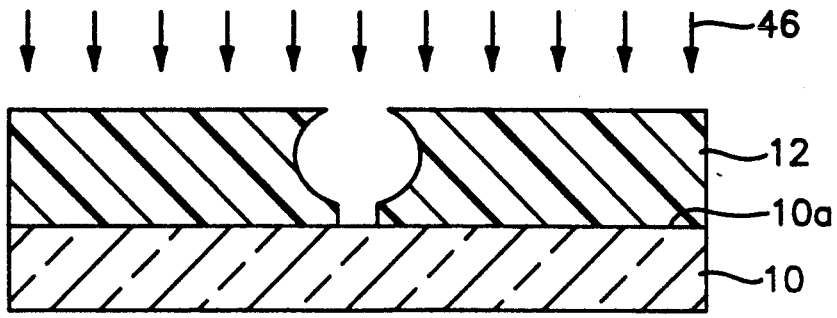

As illustrated in FIG. 11, high pressure isotropic RIE is performed using O₂ plasma as indicated by arrows 44 to form a cavity 12d underlying the opening 14a having a width which is considerably larger than W. In this case, it is desirable that the isotropic RIE step is also performed at low plasma potential, typically less than −45 Volts, in order to prevent damage to the underlying HEMT device. The masking layer 14 is removed in the step illustrated in FIG. 12 using RIE with a CF₄ plasma as indicated by arrows 46. The conditions for the removal of the masking layer 14 will generally be similar to those described above, with reference to FIG. 6.

Figure 13:
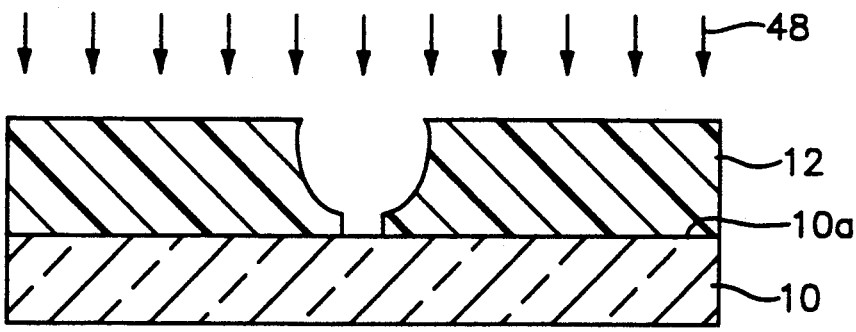

In the next step of the method as illustrated in FIG. 13, low voltage anisotropic RIE is performed using an O₂ plasma as indicated by arrows 48. This step causes the overhang of the resist cavity 12a to be removed and as described previously, may not be necessary if the overhang is already suitable. The conditions under which the isotropic and anisotropic RIE steps are performed will generally be similar to those described above with reference to FIGS. 1 to 6. The steps of FIGS. 7 to 9 may then be performed to form a T-gate structure and associated elements in the same manner as with the structure illustrated in FIG. 6.

Figure 14:
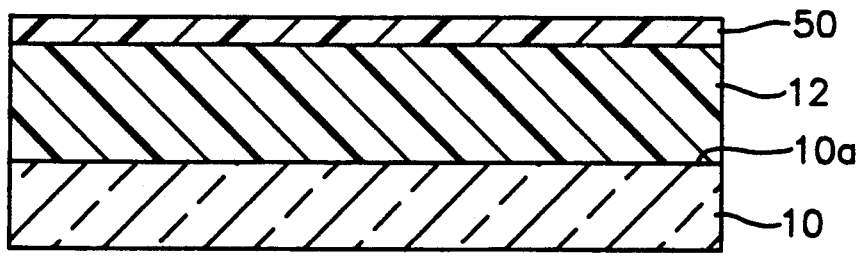
FIGS. 14 to 18 are simplified sectional views illustrating another method of fabricating a T-gate structure according to the invention, using a two level resist system.

Another method of practicing the present invention is illustrated in FIGS. 14 to 18, in which the masking layer 14 and second resist layer 16 are incorporated into a single resist layer 50. As illustrated in FIG. 14, the resist layer 50 is formed over the first resist layer 12, and consists of a material which is sensitive to FIB, electron beam, optical beam or x-ray beam imaging as appropriate to provide the function of the second resist layer 16, and also contains a material such as silicon, which resists the oxygen etching step, to provide the function of the masking layer 14.

Figure 15:
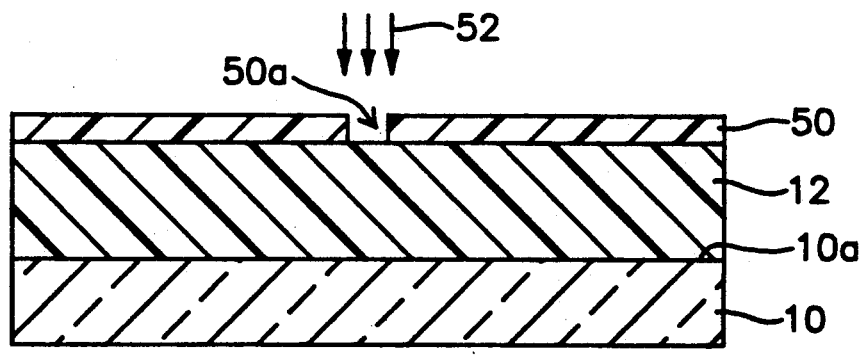
Figure 16:
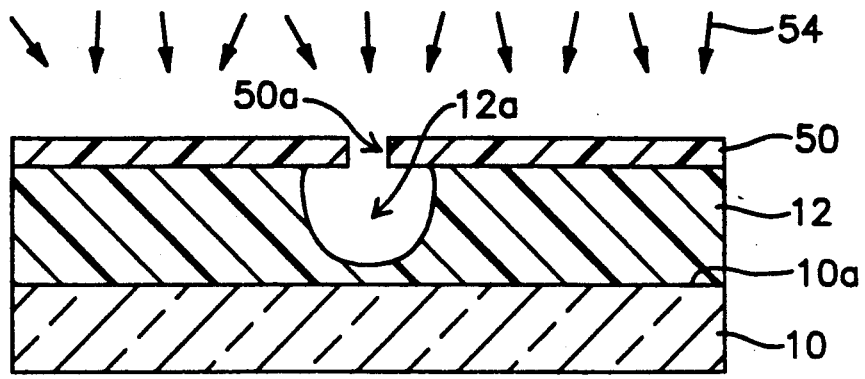

As illustrated in FIG. 15, the resist layer 50 is imaged with an FIB, electron beam, optical beam or X-ray beam as indicated by arrows 52, and developed to form an opening 50a which is equivalent to the openings 14a and 16a in combination. The resist layer 50 may alternatively be formed of a self-developing organosilicon film such as described in an article entitled "Plasma-deposited organosilicon thin films as dry resists for deep ultraviolet lithography", by M. Horn et al, in the Journal of Vacuum Science Technology, B, Vol. 8, No. 6, Nov./Dec. 1990, pp. 1493–1496, in which case a separate developing step is not required. Then, as illustrated in FIG. 16, isotropic RIE is performed using O₂ plasma to form the cavity 12a in the first resist layer 12 under the opening 50a. The silicon in the resist layer 50 is oxidized by the plasma, and forms a silicon dioxide coating on the exposed surface of the layer 50 which resists further etching by the O₂ plasma.

Figure 17:
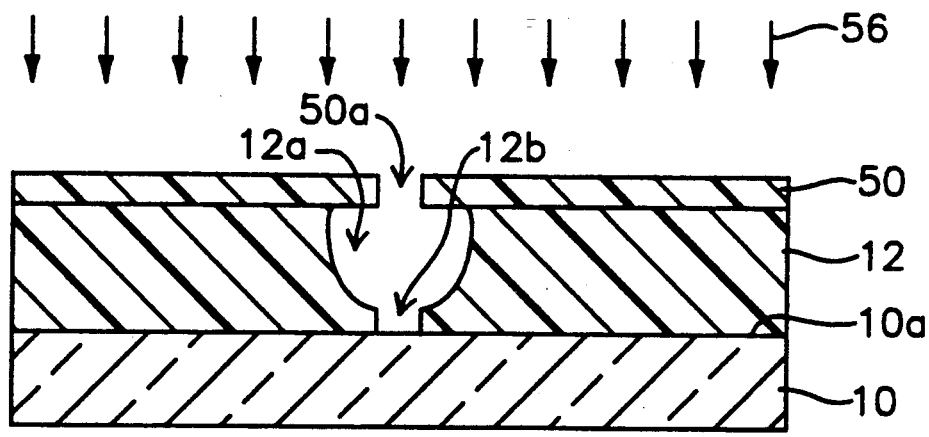
Figure 18:
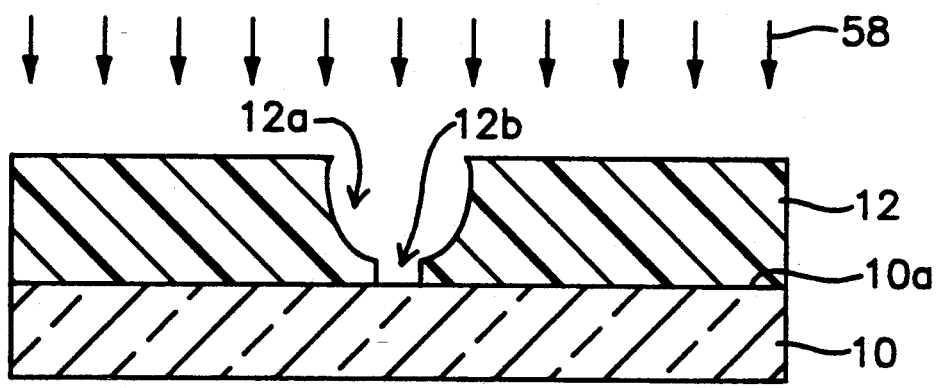

As illustrated in FIG. 17, anisotropic RIE is performed using an O₂ plasma as indicated by arrows 56 to transfer the opening 50a down through the bottom of the cavity 12a to form the notch 12b in the manner described above in reference to FIG. 5. Etching with CF₄ is then performed as indicated by arrows 58 in FIG. 18 to remove the resist layer 50 and leave only the first resist layer 12 having the cavity 12a and notch 12b therein remaining on the substrate 10. The conditions under which the isotropic and anisotropic RIE steps are performed will generally be similar to those described above with reference to FIGS. 1 to 6. Should an unsuitable overhang remain after the isotropic RIE step, a removal step may also be inserted as described previously. The steps of FIGS. 7 to 9 may then be performed to form a T-gate structure and associated elements in the same manner as with the structure illustrated in FIG. 6.

Yet another method of practicing the present invention using a single resist layer is illustrated in FIGS. 19 to 25. This method utilizes a Positive Resist IMage by Etching (PRIME) process which is described in an article entitled "Positive resist image by dry etching: New dry developed positive working system for electron beam and deep ultraviolet lithography", by C. Pierrat et al, in the Journal of Vacuum Science Technology B, Vol. 7, No. 6, Nov./Dec. 1989, pp. 1782-1786.

Figure 19:
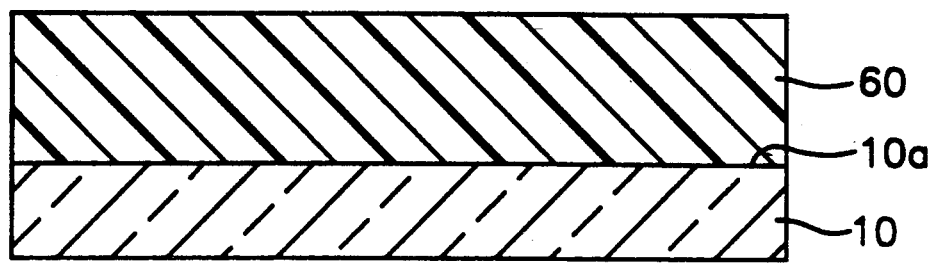
FIGS. 19 to 25 are simplified sectional views illustrating yet another method of fabricating a T-gate structure according to the invention, using a single level of resist.

FIG. 19 illustrates the substrate 10 with a primary resist layer 60 formed on the surface 10a thereof. The layer 60 is preferably formed of PLASMASK resist manufactured by U.C.B. Electronics, HPR 206 resist manufactured by Olin Hunt, PR 1024 manufactured by MacDermid, or other positive novolac based resist. The layer 60 is applied to the substrate 10 by coating and soft baking.

Figure 20:
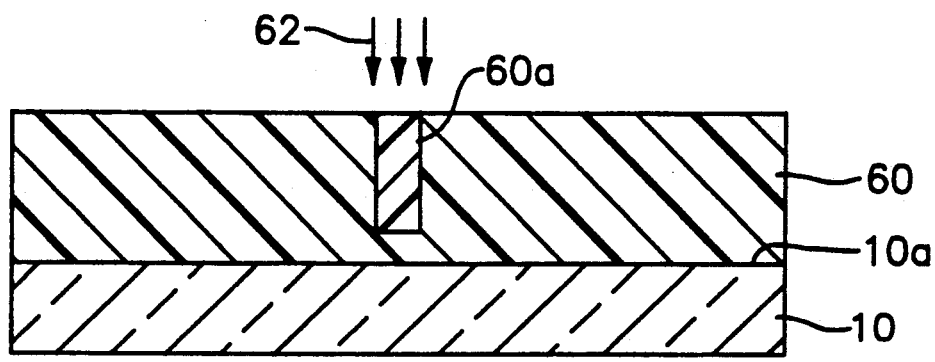

As illustrated in FIG. 20, the resist layer 60 is exposed to an electron beam, focused ion beam, optical beam in the deep ultraviolet wavelength region, or x-ray beam having a width substantially equal to the desired gate length of the T-gate structure as indicated by arrows 62. The power level of the image beam 62 is selected such that the beam 62 penetrates partially through the layer 60 in an area 60a to cause crosslinking between novolac chains in the material thereof.

Figure 21:
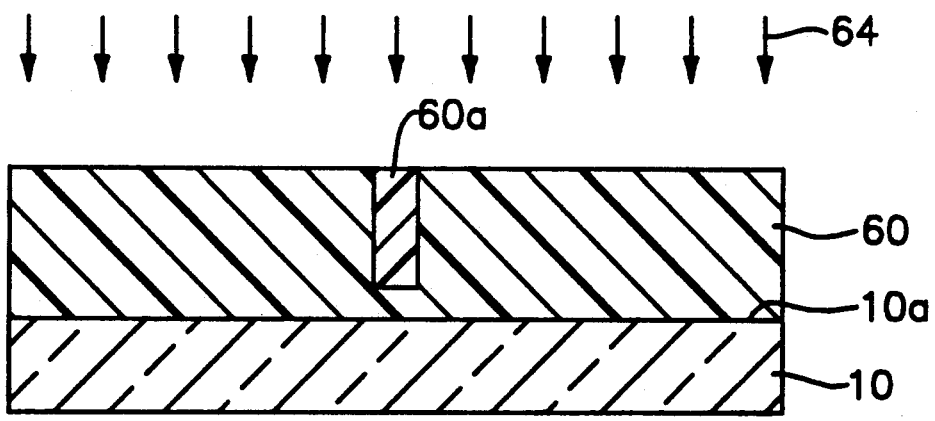

In the next step of the method as illustrated in FIG. 21, the resist layer 60 is irradiated with a flood optical beam as indicated by arrows 64 in the near ultraviolet wavelength region. This promotes diffusion and reaction of HMDS in the areas of the layer 60 other than the area 60a.

Figure 22:
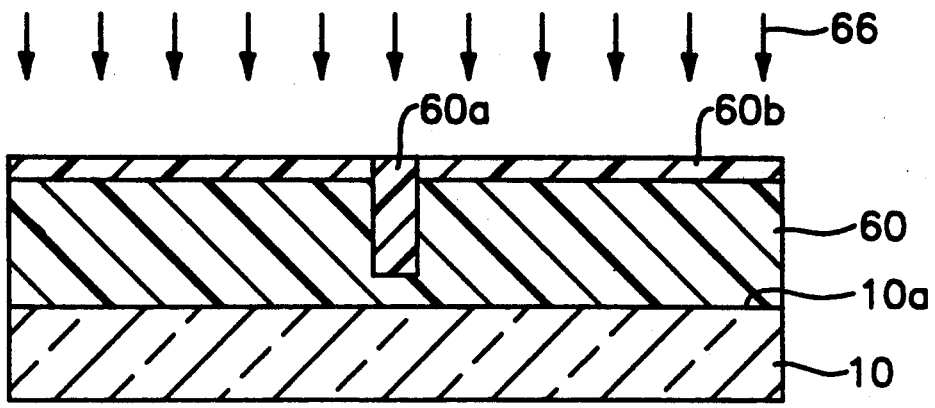

As illustrated in FIG. 22, the resist layer 60 is subjected to a pre-silylation bake step, followed by a silylation step as indicated by arrows 66. The steps may be performed at the same or different temperatures, typically on the order of 160° C., in an oven which is evacuated for the pre-silylation bake step. Hexamethyldisilazane (HMDS) saturated nitrogen is caused to flow through the oven for the silylation step.

Silylation occurs in an upper portion 60b of the resist layer 60 except for the area 60a during the silylation step illustrated in FIG. 22 due to enhancement of diffusion and reaction of HMDS induced by the near ultraviolet exposure in the step of FIG. 21. However, crosslinking inhibits HMDS diffusion in the area 60a.

Figure 23:
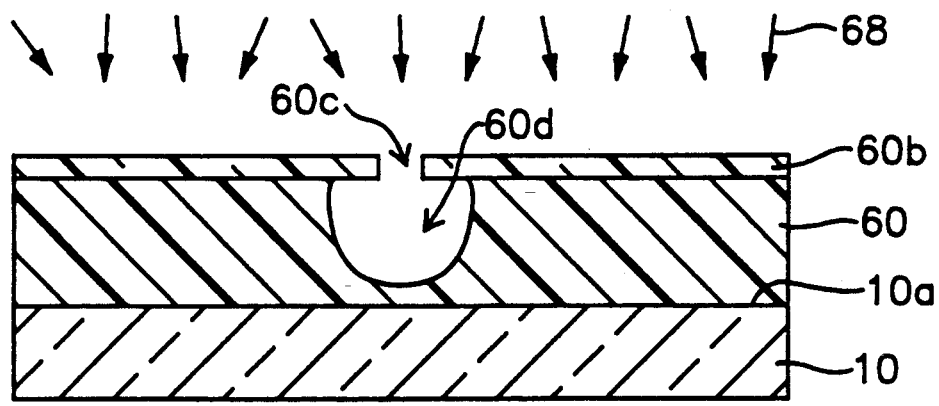

As illustrated in FIG. 23, isotropic RIE using $O_2$ plasma is performed as indicated by arrows 68 which etches away the area 60a of the layer 60 and forms an opening 60c in the upper portion of the area 60a. The RIE further extends through the opening 60c to form a cavity 60d in the layer 60 which is underneath and wider than the opening 60c. During this step, silicon (diffused from the HMDS) in the material of the layer 60 chemically transforms the upper portion 60b of the layer 60 into silicon dioxide which constitutes an in-situ mask corresponding to the masking layer 14 illustrated in FIGS. 1 to 5. The silicon dioxide is resistant to etching by the $O_2$ plasma.

Figure 24:
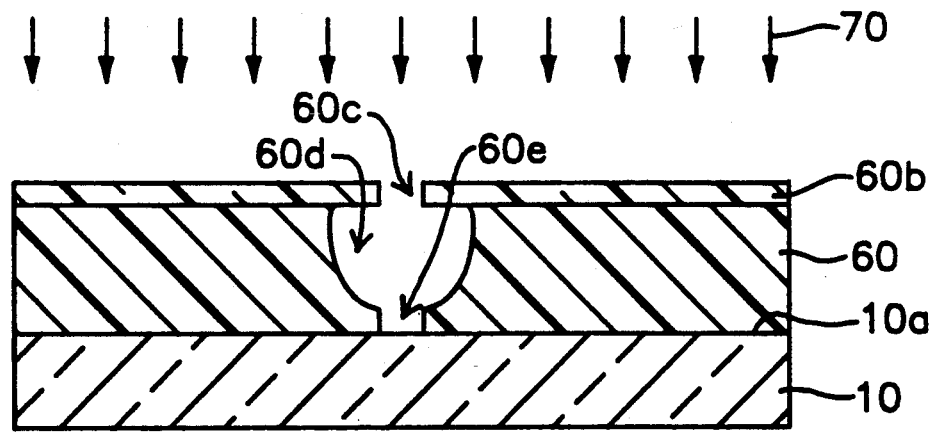

In the next step of the method as illustrated in FIG. 24, anisotropic RIE using $O_2$ plasma is performed as indicated by arrows 70 to transfer an image of the opening 60c down through the bottom of the cavity 60d to the surface 10a of the substrate 10 to form a notch 60e having substantially the same width as the opening 60c.

Figure 25:
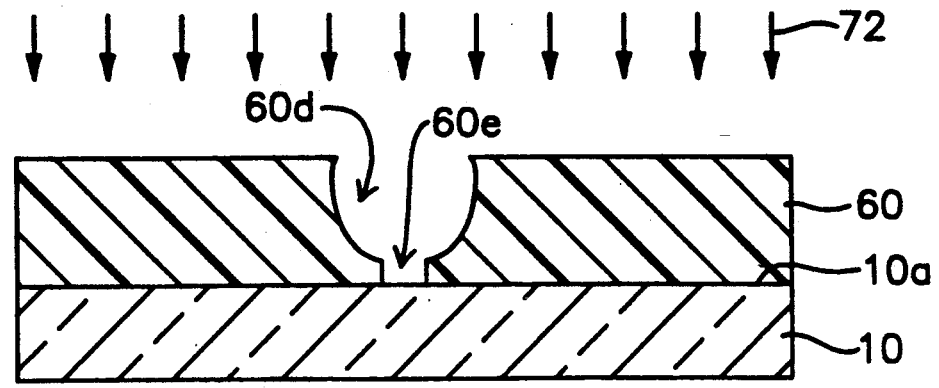

As illustrated in FIG. 25, RIE using $CF_4$ plasma is performed as indicated by arrows 72 to etch away the silicon dioxide upper portion 60b of the layer 60. Optionally, if a substantial overhang remains on the cavity 60d, it may be removed with a low pressure, low voltage oxygen anisotropic RIE step as described previously. The result of these steps is to leave the resist layer 60 with the cavity 60d and notch 60e formed therein. The conditions under which the isotropic and anisotropic RIE steps are performed will generally be similar to those described above with reference to FIGS. 1 to 6. It is also understood that other plasma etching techniques such as may be substituted for the isotropic and anisotropic RIE steps, as described previously. The steps of FIGS. 7 to 9 may then be performed to form a T-gate structure and associated elements in the same manner as with the structure illustrated in FIG. 6.

EXAMPLE

Using the preferred embodiment as described above, T-gate structures were fabricated on GaAs substrates with 50 -60 nm gate lengths, a source/drain spacing (determined by the width of the cavity formed in the isotropic RIE step) of 225 nm and a gate cross section of 0.15 um$^2$.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. A method of forming a T-gate structure on a surface of a microelectronic device substrate, comprising the steps of:
    (a) forming a first material layer over said surface;
    (b) forming a second material layer over the first material layer;
    (c) forming an opening having a predetermined width through the second material layer;
    (d) isotropically etching the first material layer through said opening using an etchant which does not significantly etch the second material layer to form a cavity in the first material layer under said opening which extends partially through to said surface and has a width which is larger than said predetermined width;
    (e) anisotropically etching the first material layer through said opening using an etchant which does not significantly etch the second material layer to form a notch in the first material layer under said opening which extends completely through to said surface and has a width which is substantially equal to said predetermined width;
    (f) removing the second material layer from the first material layer;
    (g) depositing an electrically conductive material over the first material layer and into said cavity and said notch such that the conductive material adheres to said surface at the bottom of said notch, the conductive material in the cavity and notch constituting the T-gate structure; and
    (h) removing the first material layer and the conductive material over the first material layer from the substrate.

2. A method as in claim 1, in which step (d) is performed before step (e).

3. A method as in claim 1, in which step (e) is performed before step (d).

4. A method as in claim 1, in which:
step (b) comprises forming the second material layer as including a masking sublayer over the first material layer, and a resist sublayer over the masking sublayer; and
step (c) comprises the substeps of:
(i) exposing the resist sublayer with an image having a width which is substantially equal to said predetermined width;
(j) developing the resist sublayer using a developer which does not significantly etch the masking sublayer to form a first portion of said opening as corresponding to said image and extending completely through the resist sublayer to the masking sublayer; and
(k) etching the masking sublayer through said first portion of said opening using an etchant which does not significantly etch the resist sublayer to form a second portion of said opening which extends completely through the masking sublayer to the first material layer.

5. A method as in claim 4, in which step (i) comprises exposing the resist sublayer to said image in the form of a focused ion beam.

6. A method as in claim 4, in which step (k) includes etching the masking sublayer using plasma etching.

7. A method as in claim 4, in which:
step (b) comprises forming the masking sublayer as including a material selected from the group consisting of silicon and germanium.

8. A method as in claim 7, in which step (k) comprises etching the masking sublayer using anisotropic reactive ion etching with a carbon tetrafluoride plasma.

9. A method as in claim 4, in which step (f) comprises the substep, performed integrally with step (d), of:
(1) removing the resist sublayer from the masking sublayer using said isotropic etching.

10. A method as in claim 9, in which step (f) further comprises the substep, performed after step (e), of:
(m) removing the masking sublayer from the first material layer.

11. A method as in claim 1, in which:
step (b) comprises forming the second material layer of a resist material; and
step (c) comprises the substeps of:
(i) exposing the second material layer with an image having a width which is substantially equal to said predetermined width; and
(j) developing the second material layer to form said opening as corresponding to said image and extending completely through the second material layer to the first material layer.

12. A method as in claim 11, in which:
step (b) comprises forming the second material layer of a self-developing resist material; and
step (j) is accomplished by performing step (i).

13. A method as in claim 11, in which step (i) comprises exposing the resist sublayer to said image in the form of a focused ion beam.

14. A method as in claim 1, in which step (d) comprises isotropically etching the first material layer using reactive ion etching.

15. A method as in claim in which step (e) comprises anisotropically etching the first material layer using reactive ion etching.

16. A method as in claim 1, in which:
step (d) comprises isotropically etching the first material layer using reactive ion etching at a first chamber pressure; and
step (e) comprises anisotropically etching the first material layer using reactive ion etching at a second chamber pressure which is lower than the first chamber pressure, and at a plasma potential which is sufficiently low to preclude damage to said surface.

17. A method as in claim 1, in which:
step (a) comprises forming the first material layer as including a polymer resist material;
step (d) comprises isotropically etching the first material layer using reactive ion etching with an $O_2$ plasma at a chamber pressure of approximately 90 mTorr and a plasma potential of approximately 75 volts; and
step (e) comprises anisotropically etching the first material layer using reactive ion etching with $O_2$ ions at a chamber pressure of approximately 2 mTorr and a plasma potential of approximately 45 volts.

18. A method as in claim 17, in which step comprises forming the first material layer as including polymethylmethacrylate.

19. A method as in claim 1, in which steps (a) and (b) in combination comprise the substeps of:
(i) forming a primary material layer including a lower portion which constitutes the first material layer, and an upper portion, over said surface; and
(j) chemically transforming said upper portion of the primary material layer into the second material layer.

20. A method of forming a T-gate structure on a surface of a microelectronic device substrate, comprising the steps of:
(a) forming a resist layer of a first material over said surface;
(b) exposing an area of the resist layer with an image having a predetermined width;
(c) exposing the resist layer to a predetermined condition which transforms an upper portion of the resist layer except in said exposed area into a second material;
(d) etching said exposed area using an etchant which does not significantly etch the second material to form an opening through said upper portion having substantially said predetermined width;
(e) isotropically etching a lower portion of the resist layer below said upper portion thereof through said opening using an etchant which does not significantly etch the second material to form a cavity in said lower portion under said opening which extends partially through to said surface and has a width which is larger than said predetermined width;
(f) anisotropically etching said lower portion through said opening using an etchant which does not significantly etch the second material to form a notch in said lower portion under said opening which extends completely through to said surface and has a width which is substantially equal to said predetermined width;
(g) removing said upper portion from said lower portion;
(h) depositing an electrically conductive material over said lower portion and into said cavity and said notch such that the conductive material adheres to said surface at the bottom of said notch, the conductive material in the cavity and notch constituting the T-gate structure; and (i) removing said lower portion and the conductive material over said lower portion from the substrate.

21. A method as in claim 20, in which step (a) comprises forming the resist layer such that said first material includes a novolac resin in which crosslinking between novolac chains occurs in said exposed area in step (b), and said upper portion of the resist layer except in said exposed area is transformed into said second material through silylation in step (c).

22. A method as in claim 21, in which step (b) comprises exposing said area of the resist layer with said image in the form of an electron beam.

23. A method as in claim 21, in which step (b) comprises exposing said area of the resist layer with said image in the form of a focused ion beam.

24. A method as in claim 21, in which step (c) comprises the substeps of:

(j) exposing the resist layer to light in the near ultraviolet wavelength region; and (k) heating the resist layer to cause silylation of said upper portion thereof.

25. A method as in claim 21, in which steps (d) and (e) are integral and comprise etching said exposed area and said lower portion using isotropic reactive ion etching with $O_2$ plasma which oxidizes said second material.

26. A method as in claim 21, in which step (f) comprises anisotropically etching said lower portion using reactive ion etching with $O_2$ plasma.

27. A method as in claim 21, in which:

steps (d) and (e) are integral and comprise etching said exposed area and said lower portion using isotropic reactive ion etching with $O_2$ plasma at a first chamber pressure; and step (f) comprises anisotropically etching said lower portion using reactive ion etching with $O_2$ plasma at a second chamber pressure which is lower than the first chamber pressure, and at a plasma potential which is low enough to preclude damage to said surface.

28. A method of forming a T-gate structure on a surface of a microelectronic device substrate, comprising the steps of:

(a) forming a first material layer over said surface;

(b) forming a second material layer over the first material layer;

(c) forming an opening having a predetermined width through the second material layer;

(d) forming a cavity in the first material layer under said opening which extends partially through to said surface and has a width which is larger than said predetermined width;

(e) forming a notch in the first material layer under said opening using the second material layer with said opening formed therethrough as a mask such that the notch extends completely through to said surface and has a width which is substantially equal to said predetermined width; and (f) forming a T-gate contact to said surface through said notch.

29. A method as in claim 28, in which step (d) is performed before step (e).

30. A method as in claim 28, in which step (e) is performed before step (d).

* * * * *